United States Patent
Gillespie et al.

(10) Patent No.: US 7,248,192 B2
(45) Date of Patent: Jul. 24, 2007

(54) DIGITAL TO ANALOG CONVERTER AND A GROUND OFFSET COMPENSATION CIRCUIT

(75) Inventors: Alan Gillespie, East Lothian (GB); Roderick C. McLachlan, Edinburgh (GB); Teng-Hee Lee, Edinburgh (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/266,041

(22) Filed: Nov. 3, 2005

(65) Prior Publication Data
US 2007/0096965 A1    May 3, 2007

(51) Int. Cl.
*H03M 1/06* (2006.01)

(52) U.S. Cl. .................... 341/118; 341/120; 341/144; 341/154

(58) Field of Classification Search ......... 341/153–154
See application file for complete search history.

(56) References Cited

U.S. PATENT DOCUMENTS

| | | | |
|---|---|---|---|
| 4,491,825 A | * | 1/1985 | Tuthill ..................... 341/145 |
| 4,843,394 A | * | 6/1989 | Linz et al. ................ 341/154 |
| 5,212,484 A | * | 5/1993 | Hillis ....................... 341/154 |
| 6,204,785 B1 | * | 3/2001 | Fattaruso et al. .......... 341/120 |
| 6,750,797 B1 | * | 6/2004 | Gunther ................... 341/144 |
| 6,859,157 B1 | * | 2/2005 | Gunther ................... 341/144 |

* cited by examiner

*Primary Examiner*—Khai M. Nguyen
(74) *Attorney, Agent, or Firm*—Wolf, Greenfield & Sacks P.C.

(57) ABSTRACT

A digital to analog converter comprising: a digital to analog conversion core adapted to receive at least one reference voltage and a digital word to be converted, and to output an analog voltage as a function of the digital word and the at least one reference voltage; a sensing circuit for sensing a difference between a first ground voltage associated with an output of the digital to analog converter and a ground reference voltage occurring at the digital to analog converter; and a compensation circuit for applying a compensation voltage to the at least one reference voltage used by the conversion core of the digital to analog converter.

24 Claims, 8 Drawing Sheets

DIGITAL TO ANALOG CONVERTER AND A GROUND OFFSET COMPENSATION CIRCUIT

FIELD OF THE INVENTION

The present invention relates to a digital to analog converter and to a ground offset compensation circuit.

BACKGROUND OF THE INVENTION

There has been an increasing requirement to provide digital to analog converters with increasing resolution. As a result, 16 bit digital to analog converters are now commercially available at relatively inexpensive prices. Simultaneously there remains a desire to reduce the component count within a circuit and this has resulted in multi-channel digital to analog converters becoming popular. Placing multiple digital to analog converters within a single chip is relatively simple to do whilst the resolution of the converter remains relatively low, for example 8 bits. However as the resolution of the converter is increased problems such as accurately defining a ground voltage can arise. Normally a multi-chip digital to analog converter produces multiple outputs with voltages with respect to a single "ground" reference. However the circuits being driven by the outputs of the digital to analog converter may not be tightly grouped together on the circuit board and, as a consequence, each circuit may experience a slightly different "ground" voltage due, for example, to current flow through the conductors defining the ground path. Thus, whilst the ground voltages of various circuits may approximately the same, they may not be exactly at the same voltage as a "reference ground" voltage experienced at the digital to analog converter. To put this in perspective, if a 16 bit digital to analog converter has an output range spanning between zero and 10 volts then the size of one least significant bit (LSB) is only 150 µV. For a device having an output between −10 and +10 volts the LSB would become 300 µv. It can be seen that current flows occurring within the conductors defining the ground voltage could easily give rise to voltage drops significantly greater than 150 µV, and in some situations the local ground voltage at a device receiving an output from the DAC could differ from the local ground voltage at the DAC by the equivalent of 100 or so least significant bits. Thus the use of an assumed ground voltage occurring in each circuit driven by the multi-channel digital to analog converter is incorrect and may significantly degrade the performance of the circuit away from its nominal 16 bit resolution and associated accuracy.

SUMMARY OF THE INVENTION

According to a first aspect of the present invention there is provided a digital to analog converter comprising a digital to analog conversion core adapted to receive at least one reference voltage and a digital word to be converted, and to output an analog voltage as a function of the digital word and the reference voltage, and a sensing circuit for sensing the difference between a first ground voltage associated with an output of the digital to analog converter and a ground reference voltage occurring at the digital to analog converter, and a compensation circuit for applying a compensation voltage to the at least one reference voltage used by the conversion core of the digital to analog converter.

It is thus possible to compensate for variations in the "ground voltage" occurring at a circuit connected to the output of a digital to analog converter and the ground voltage at the digital to analog converter itself.

In general the digital to analog converter further includes an output amplifier that serves to buffer the digital to analog conversion core from the circuit that is driven by the digital to analog converter. It might be thought that offset correction could be applied at the output amplifier, but as we will show later, doing this when using a DAC core which is configured to supply an output current representative of the input word would result in a gain being applied to the offset which varies as a function of the code being converted by the converter core. This problem is obviated when the offset correction is applied to the reference voltages used by the digital to analog conversion core. Typically a digital to analog converter core comprises a plurality of resistors arranged in series. One end of this "chain" of resistors is connected to a first reference voltage, typically "$V_{REF+}$" whilst the other end of this resistor string may be connected to a local ground voltage or to a second reference voltage "$V_{REF-}$" which in general may be any reference voltage less than $V_{REF+}$ and consequently may be a positive voltage with respect to the local ground at the digital to analog converter, may be substantially at ground or may be a negative voltage.

Preferably the digital to analog converter core comprises an R-2R ladder, which is a conversion topology well known to the person skilled in the art. In a R-2R ladder, working from the most significant bit to the least significant bit the current that flows from each successive tap in the R-2R ladder is half the current that flows in the preceding tap. Each tap is followed by an electrically controllable switch, which in a real world implementation will typically be a field effect transistor, such as a switching MOSFET, and consequently each transistor will exhibit a finite impedance $R_{DS,\,ON}$ when switched fully on. It is known, in order not to perturb the operation of the R-2R ladder, that the on resistance of these electronic switches needs to be varied depending upon their position within the R-2R ladder. This is done by scaling the size of the transistors such that, if the least significant bit transistor has a width to length ratio of unit size, then the second most significant bit transistor has a size of two units as it has to cope with twice the current flow, the next transistor has a size of four units as it has to cope with four times the current flow, and so on, thereby ensuring that the voltage dropped across each transistor is the same. Often the digital to analog converter core is fabricated utilising both segmented and R-2R architectures to improve dynamic non-linearity. Typically the least significant bits of the core will be implemented using an R-2R architecture whereas the most significant bits of the core will be implemented using a segmented architecture where each switching transistor passes the same current, and consequently are fabricated with the same size. In such a scheme the transistors in the segmented portion are driven in a "thermometer decoded" style.

Preferably a reference voltage generator is provided for generating at least one reference voltage. The compensation circuit receives the at least one reference voltage and applies an offset thereto based on the difference between a local ground voltage, which may be referred to as "ref-ground" and a remote ground voltage occurring at the circuit being driven by the digital to analog converter, herein referred to as "out-ground". Advantageously the reference voltage generator outputs first and second reference voltages, which may be referred to as "ref-pos" and "ref-neg" or alternatively $V_{REF+}$ and $V_{REF-}$. Advantageously an offset compensation resulting from the difference between the local and remote ground voltages is applied to both $V_{REF+}$ and $V_{REF-}$.

In an embodiment of the present invention there is provided a digital to analog converter comprising:

a reference circuit having a first reference circuit input and a first reference output adapted in use to output a first reference voltage referred with respect to a reference circuit ground;

a digital to analog conversion core having a digital to analog core reference input, first and second digital to analog converter core outputs, and a digital input for receiving a digital word that is to be represented in analog form, wherein a plurality of resistive elements are selectively connectable between the digital to analog converter core reference input and either of the first and second digital to analog converter core outputs in response to the digital word;

an output stage comprising an output stage operational amplifier having a non-inverting input, an inverting input and an output, where the first digital to analog converter core output is connected to the inverting input, the second digital to analog converter core output is connected to the non-inverting input and a feedback network is provided;

wherein the non-inverting input of the output stage operational amplifier and the first reference circuit input are connected to a reference ground output terminal and the reference circuit includes an offset generator for modifying the first reference output voltage as a function of the voltage at the first reference circuit input.

The reference circuit may advantageously generate a second reference output voltage which is supplied to the inverting input of the output stage operation amplifier via a resistor, and the offset generator may be further adapted to modify the second reference output voltage as function of the voltage at the first reference circuit input.

Preferably the compensation circuit generates a correction voltages that varies linearly with the voltage difference between the ground reference voltage and the first ground voltage and applies this correction voltage to the first, and where provided the second, reference voltage.

The $V_{REF-}$ signal, once compensated can be applied to the inverting input of the output stage operational amplifier rather than to the "negative" end of the resistor string in the digital to analog conversion core. This can be advantageous as it allows the output of the output stage operational amplifier to swing between, say, −10 V and +10 V, whilst the converter core only has to operate between nominally 0 V and +10 V. This can be advantageous as it simplifies the design of the switching transistors which in effect act as the interface between the digital and analog parts of the circuit.

According to a second aspect of the present invention there is provided a reference circuit for supplying reference voltages, the reference circuit comprising a reference voltage generator for generating at least one reference voltage and a compensation circuit responsive to a first voltage and to a second voltage, and to modify the at least one reference voltage as a function of a difference between the first and second voltages.

According to a third aspect of the present invention there is provided a method of operating a digital to analog converter comprising the steps of:

a). Forming a difference value between a ground voltage occurring at a reference voltage generator used to supply a reference voltage to a conversion core of the digital to analog converter and a ground voltage occurring at a device driven by the digital to analog converter; and b). Applying that difference value to the digital to analog converter such that an output of the digital to analog converter is modified by the difference value.

BRIEF DESCRIPTION OF THE FIGURES

The present invention will further be described, by way of example, with reference to the accompanying drawings, in which.

DESCRIPTION OF PREFERRED EMBODIMENTS OF THE PRESENT INVENTION

Figure 1:
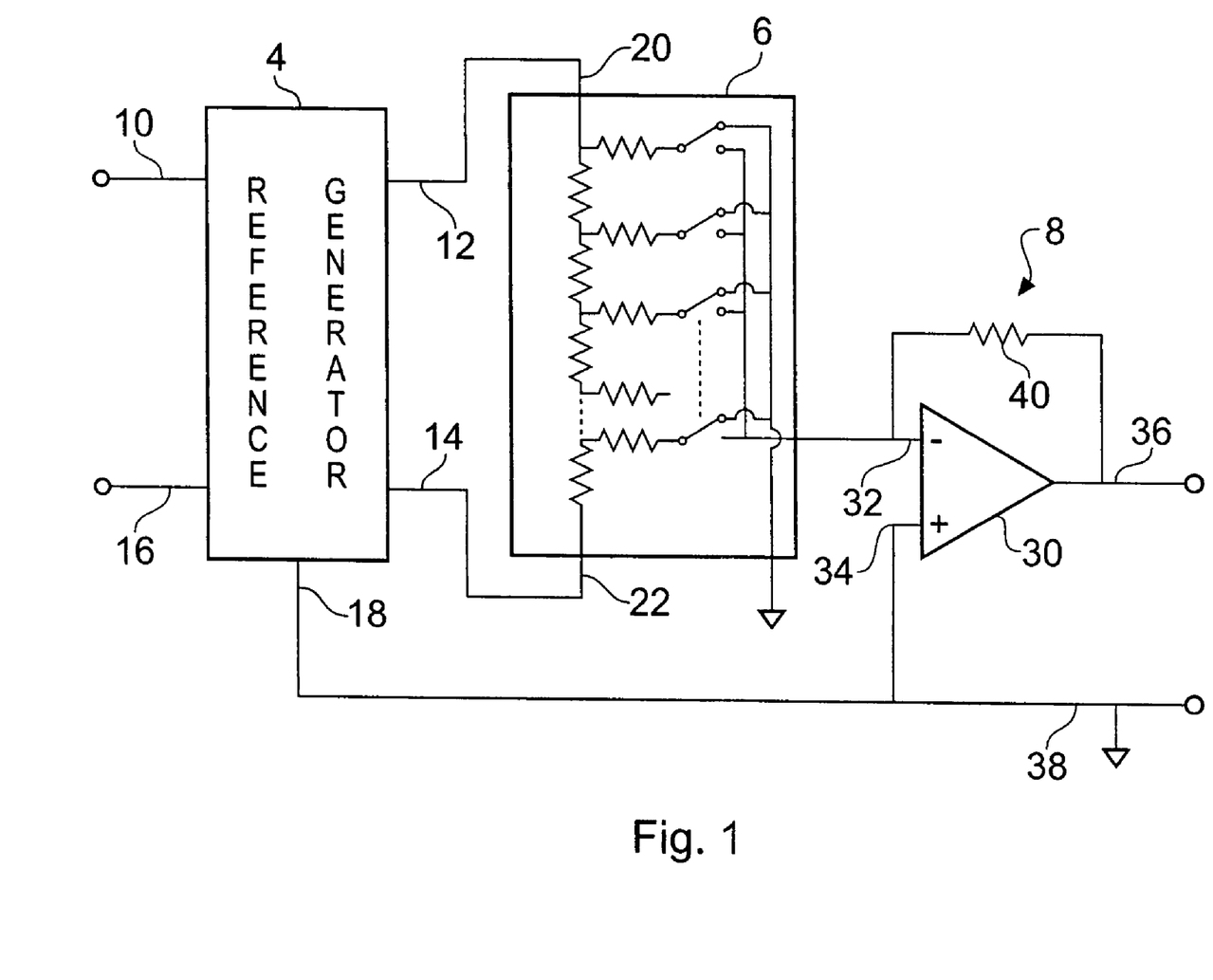
FIG. 1 schematically illustrates a digital to analog converter constituting a first embodiment of the present invention.

FIG. 1 schematically illustrates the circuit diagram of a digital to analog converter constituting a first embodiment of the present invention. The arrangement shown in FIG. 1 is expected to output a voltage in the range zero volts to a maximum $V_{OUT}$. The digital to analog converter can, in general, be considered as comprising three main parts. These are a voltage reference generator 4, a digital to analog conversion core 6, and an output stage generally designated 8. It is known that voltage references are often best provided from external circuits which have been tailored to provide an output voltage which is stable, to within predefined limits, with respect to supply voltage variation and temperature changes. Whilst the output of these circuits is well defined, their output voltages tend to be fixed to one or two values which, in general, do not correspond to voltage ranges that users wish to have digitised. Therefore the voltage reference generator 4 is arranged to receive a stable input voltage on a reference voltage input 10 and to transform this voltage to generate at least a first, and often first and second reference output voltages at first and second reference outputs 12 and 14, respectively. The reference generator 4 also includes a reference ground terminal 16 for defining the "local" ground voltage occurring at the reference generator 4. The reference circuit 4 in the present invention also includes a further input 18 for receiving an indication of an "output" ground voltage, which represents the ground voltage occurring at the output of the digital to analog converter.

At least the first reference voltage, and more usually, as in the present case, the first and second reference output voltages are applied to first and second digital to analog conversion core reference inputs 20 and 22, respectively. As will be described in more detail later, the digital to analog conversion core 6 generally comprises a plurality of resistors arranged in series such that voltages or currents can be tapped off the chain of resistors via electronically controllable switches. The switches connect to one or two outputs which are then subjected to gain and buffered by the output stage 8.

Although the digital to analog conversion core 6 used herein makes use of an R-2R configuration, and hence is well known to the person skilled in the art, it is useful to briefly consider how this works as the inherent nature of such a converter core influences the decision on where to introduce a voltage correction relating to the difference between the reference ground voltage and the ground voltage occurring at a circuit driven by the digital to analog converter.

Figure 5:
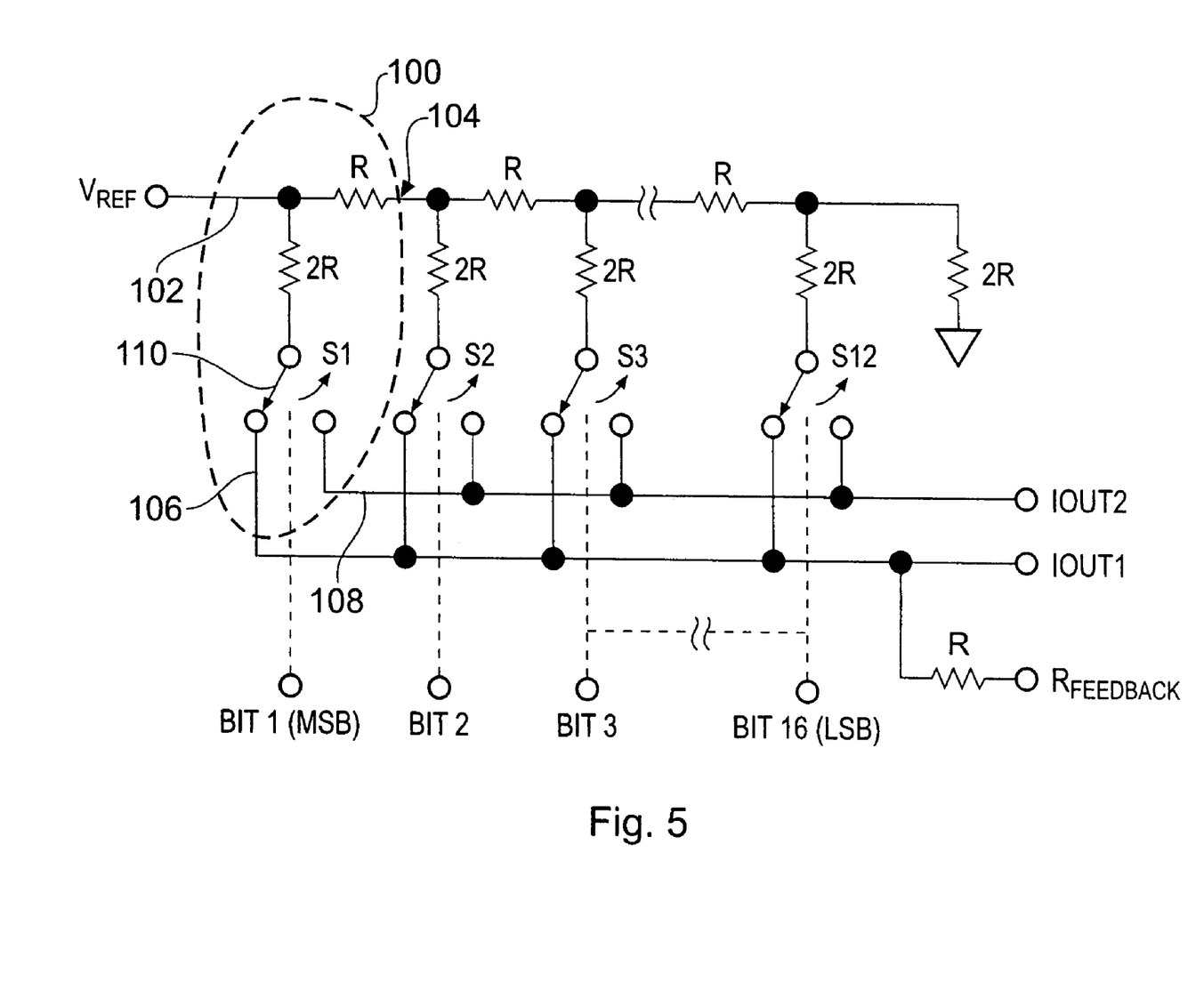
FIG. 5 schematically illustrates the construction of an R-2R ladder for use with a digital to analog converter.

An R-2R core is schematically illustrated in FIG. 5. The R-2R core is, in theory, built from a plurality of identical building blocks arranged in series. Such a building block is contained within the chain line designated 100 in FIG. 5. Each individual building block has an input 102, a chain output 104 for connection to the input of a subsequent building block (or in the case of the last block, to ground) and first and second signal outputs 106 and 108. A first resistor having a unit value R is connected between the input 102 and the chain output 104. A second resistor having a value 2R is connected between the input 102 and either of the first and second signal outputs 106 and 108, respectively, via an electrically controllable switch 110. The electrically controllable switch 110 is responsive to 1 bit of the digital word that is to be converted into the analog domain and, can be considered as being connected to the first output 106 when the bit is at a set or "1" condition and being connected to the second signal output when the bit is in a null or "0" state.

It can be seen that each of the outputs 106 and 108 of the individual building blocks are connected to common output terminals $I_{OUT1}$ and $I_{OUT2}$. In use, and as shown in FIG. 1, the R-2R converter core is followed by an operational amplifier operating in a virtual earth mode such that the output terminals $I_{OUT1}$ and $I_{OUT2}$ are held at "ground" voltage. As a consequence, the current flowing through R2 is invariant whether the switch 110 connects the resistor R2 to the first output 106 or the second signal output 108. From this it can also be seen that the current flowing through each and every one of the building blocks is invariant and that the current scales such that in the arrangement shown in FIG. 5, the current flowing through the resistor R2 of the most significant building block responsive to the control line bit 1 is twice that of the current flowing in the next building block responsive to bit 2 which in turn is twice the current flowing through the 2R resistor of the third building block which was responsive to bit 3 and so on. A further advantage of the R-2R topology is that, when viewed from the input terminal $V_{REF}$, the impedance of the R-2R network does not change with the digital code supplied to its switches.

Figure 6:
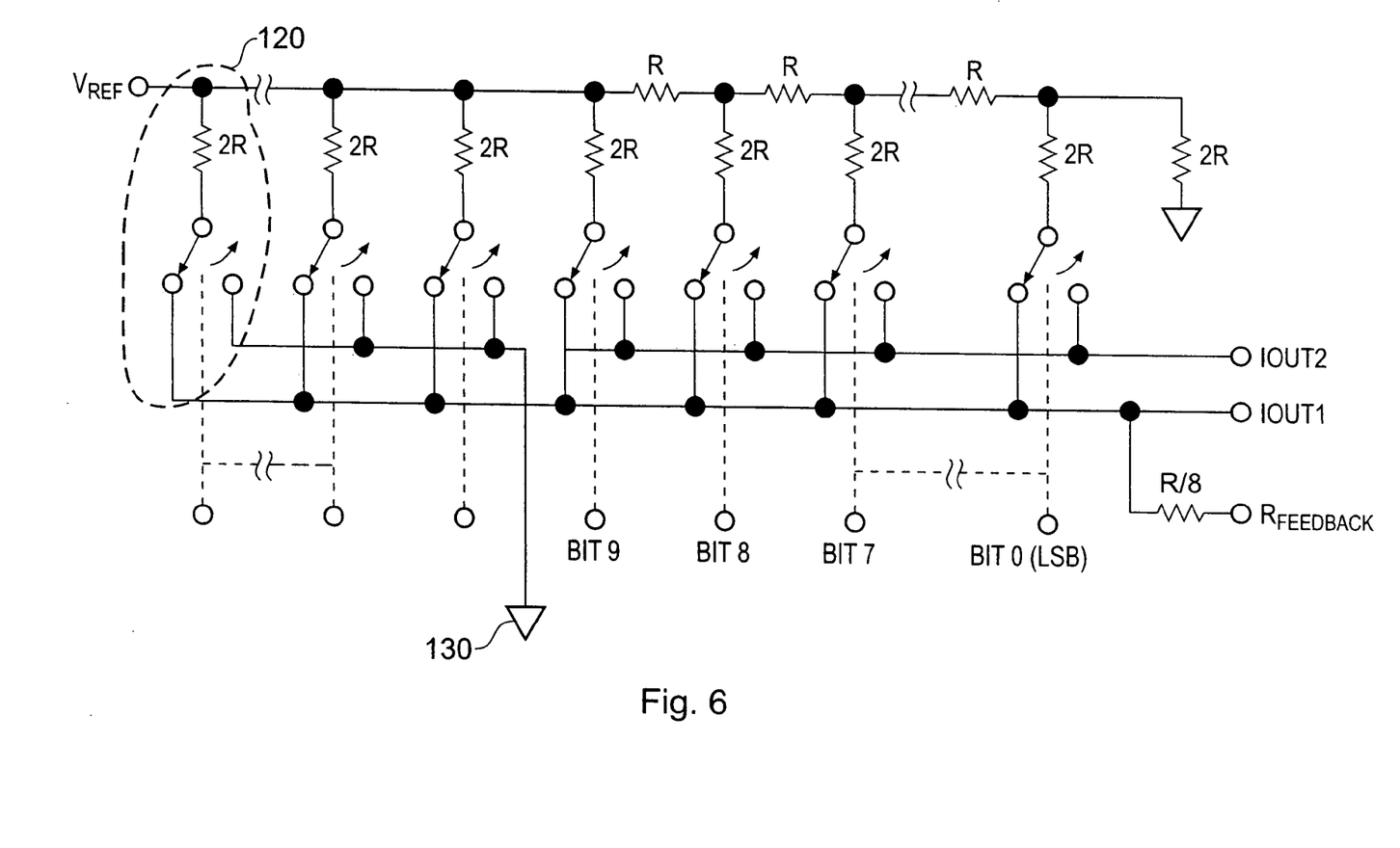
FIG. 6 schematically illustrates a segmented R-2R ladder for use with a digital to analog converter.

In the real world, each of the electrically controllable switches 110 is implemented using MOS transistors. The transistors have a finite resistance and this needs to be accounted for in the design of each of the constructional blocks. Furthermore as, starting from the least significant bit to the most significant bit, each constructional block carries half the current of the preceding block then the transistors in each block need to be scaled to a size appropriate to the current that they are handling. For a 16 bit digital to analog converter this would mean that the switching transistor or transistors for the most significant block would need to be some 32768 times ($2^{15}$) the size of the transistor associated with the least significant bit and the resistors would also need to be matched to this accuracy. This is an impractical proposition and therefore the R-2R converter may be modified, as shown in FIG. 6, such that the most significant bits, for example bits 10 to 15 are converted to thermometer encoding and then used to drive $2^6$ identical switch circuits one of which is schematically designated 120 in FIG. 6. The switch circuit 120 is similar to the building block 100 shown in FIG. 5 with the notable difference that the unit resistor 104 is missing. Therefore each of the switching units 120 is effectively connected in parallel and directly connected to the input terminal of the converter core. Therefore each switch passes the same current, hence the need for thermometer decoding. The switching blocks 120 associated with the most significant bits of the digital to analog converter core shown in FIG. 6 may be provided with their own ground connection 130. The remaining bits, bit 9 to bit 0 within the converter shown in FIG. 6 are then implemented using standard R-2R converter core.

The output of the digital to analog converter core is, in the arrangement shown in FIG. 1 buffered and amplified by an output stage. The output stage 8 comprises an output stage operational amplifier having an inverting input 32, an non-inverting input 34 and an output 36. The non-inverting input 34 is connected to an output ground connection 38. The inverting input 32 is connected to receive the output of the digital to analog converter core 6. A feedback resistor 40 extends between the output 36 and the inverting input 32. Thus, the action of the operational amplifier is such that the voltage occurring at its inverting input 32 is held to be the same as the voltage occurring at its non-inverting input 34, namely the output ground voltage. Given that no current flows into the input of the operational amplifier, all the current provided from the output of the digital to analog converter core 6 must flow through the feedback resistor 40 and the voltage occurring at the output of the amplifier 36 is whatever voltage is appropriate in order to cause this condition to arise.

Figure 2:
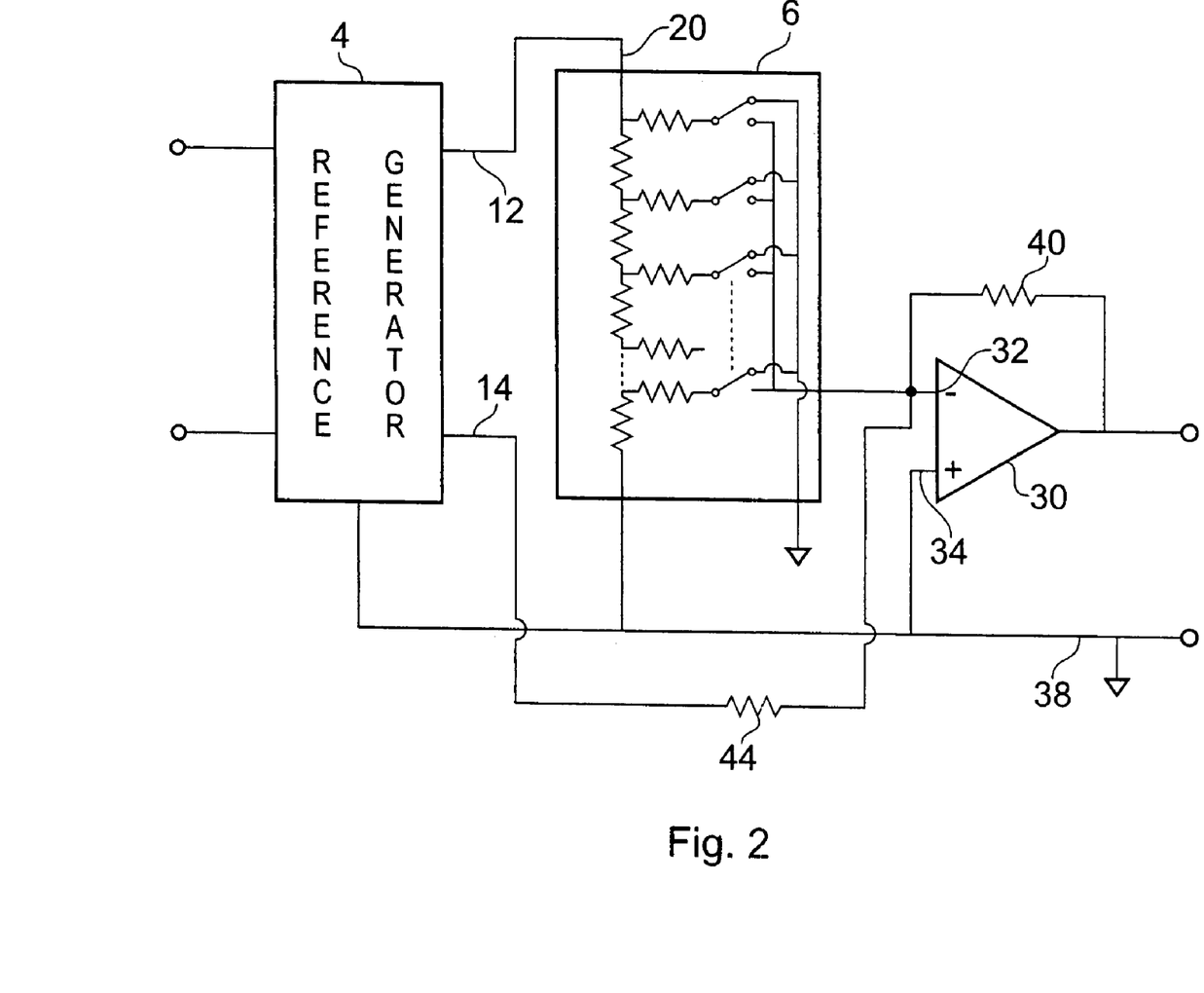
FIG. 2 schematically illustrates a further digital to analog converter constituting a second embodiment of the present invention.

Returning to the discussion of the basic topology of the circuit, FIG. 2 shows an alternative embodiment which is similar to that shown in FIG. 1 except that now the reference circuit 4 is configured to generate a positive reference output voltage $V_{REF+}$ at its first reference output terminal 12 and a negative reference output voltage $V_{REF-}$ at its second output reference terminal 14. A further change is that the digital to analog converter core 6 now has its second reference input connected to a local ground 38. The second reference voltage output 14 is connected to the inverting input 32 of the output amplifier 30 via a feedback network resistor 44.

It can be seen by inspection of FIG. 2, that this change in topology from FIG. 1 causes the output of the output amplifier 30 to swing between positive and negative output voltage limits, and to assume intermediate points therebetween in accordance with the digital code being converted by the digital to analog converter core 6.

Figure 3:
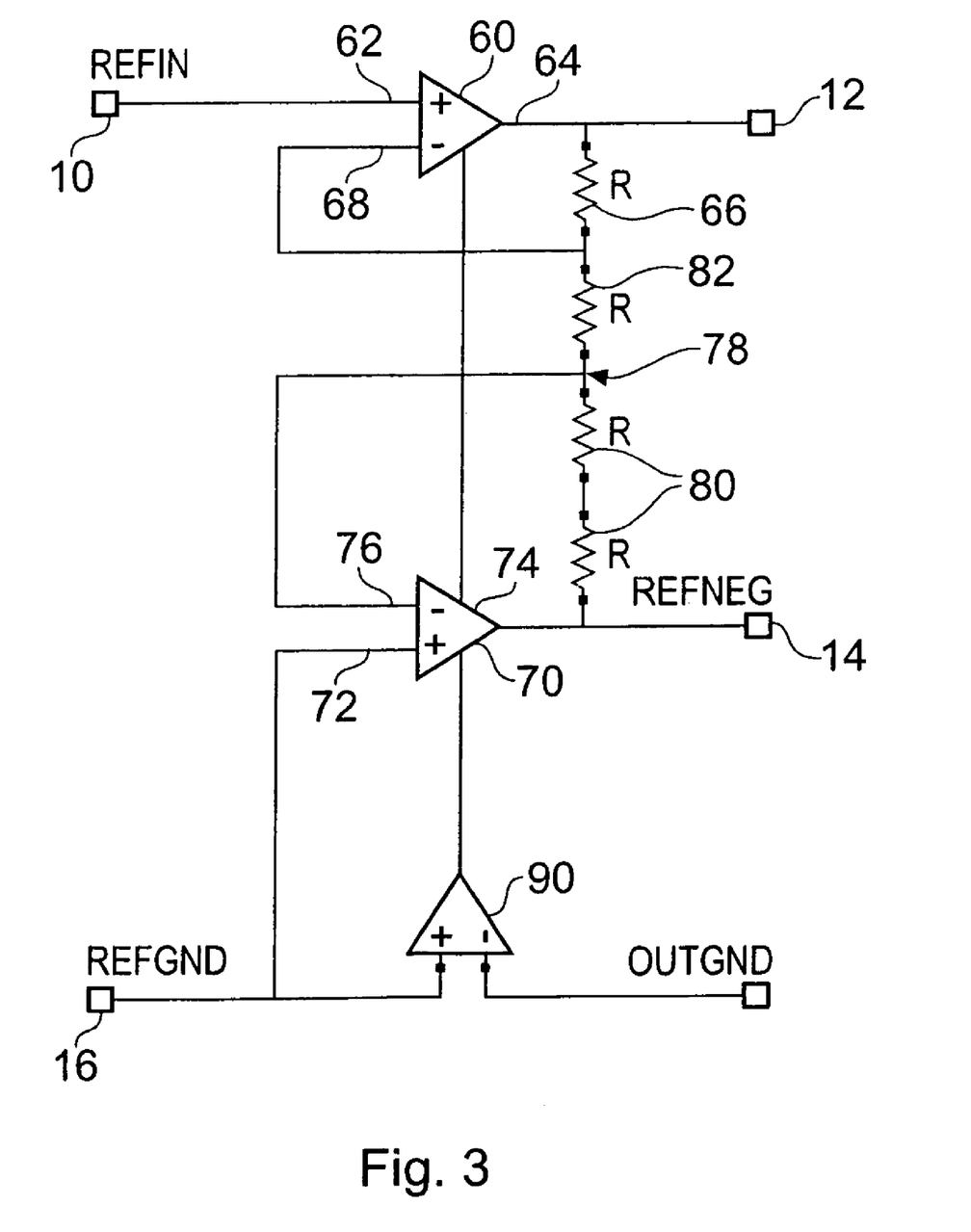
FIG. 3 illustrates a circuit diagram of a reference voltage generator including compensation means for generating a compensation voltage.

FIG. 3 schematically illustrates an embodiment of the modified reference generation circuit constituting an embodiment of the present invention.

As shown in FIG. 3 the reference circuit comprises a first reference circuit operational amplifier 60 having a non-inverting input 62 connected to a reference voltage input REFIN corresponding to terminal 10 of FIG. 1. An output 64 of the first reference circuit amplifier 60 is connected to the first reference circuit output 12 and a resistor 66 having unit value R is connected between the output 64 and an inverting input 68 of the amplifier 60.

A second reference circuit operational amplifier 70 has its non-inverting input 72 connected to the reference ground terminal corresponding to terminal 16 of FIG. 1. An output 74 of the amplifier 70 is connected to the second reference voltage output 14 for outputting a reference output voltage $V_{REF-}$. The inverting input 76 of the amplifier 70 is connected to a node 78. The output 74 of the amplifier 70 is connected to the node 78 via a resistance 80 having a value 2R, and designated in FIG. 3 by two unit value resistors. Finally, a further resistor 82 of unit value R is connected between node 78 and the inverting input 68 of the first reference circuit operational amplifier 60.

Looking at the operation of the circuit, we can assume that if the reference ground input 16 has a voltage of zero volts, then the operation of the amplifier 70 is such that node 78 is also held at zero volts. It is then apparent that the action of the operational amplifier 60 is such that its output is held at a voltage equal to twice the reference voltage. A current, I, flows through the resistors 66 and 82 towards the node 78 which acts as a virtual earth. However an equivalent current must flow from the node 78 to the output 74 of the second operational amplifier via the resistor 80. Therefore the voltage at the second reference circuit output terminal must be of the opposite sign and same magnitude as the voltage occurring at the first reference circuit output terminal. Therefore, we see that if the reference voltage is +5 volts, then the voltage occurring at the first output terminal 12 will be +10 volts, and the voltage occurring at the output terminal 14 will be −10 volts. All referenced with respect to the REF-GROUND input 16.

It can also be seen that the reference circuit further includes a device 90, represented here as an operational amplifier, for comparing the voltage occurring at the reference ground input 16 and at the output ground terminal OUTGND, and for generating a correction to be applied to the amplifiers 60 and 74 which modifies their output voltages in accordance with a difference of the voltages occurring at the reference ground and the output ground. The correction may be in direct proportion to the difference between the ground voltages such that, for example, if the output ground voltage was 5 mV above the reference ground voltage then the voltages occurring at the first and second output terminals would be increased by +5 mV such that the voltage at the first output 12 would be 10.005 volts and voltage occurring at the second output terminal 14 would be −9.995 volts.

Although, as shown in FIG. 3, it is possible to provide a separate correction device 90, it is also possible to modify each of the amplifiers 60 and 74 such that they have a correction device formed internally of the amplifier, but as a consequence each amplifier 60 and 74 further needs to be connected to the reference ground and output ground terminals. Given that the amplifiers 60 and 74 are identical, only one of these modified amplifiers needs to be described in detail.

Figure 4:
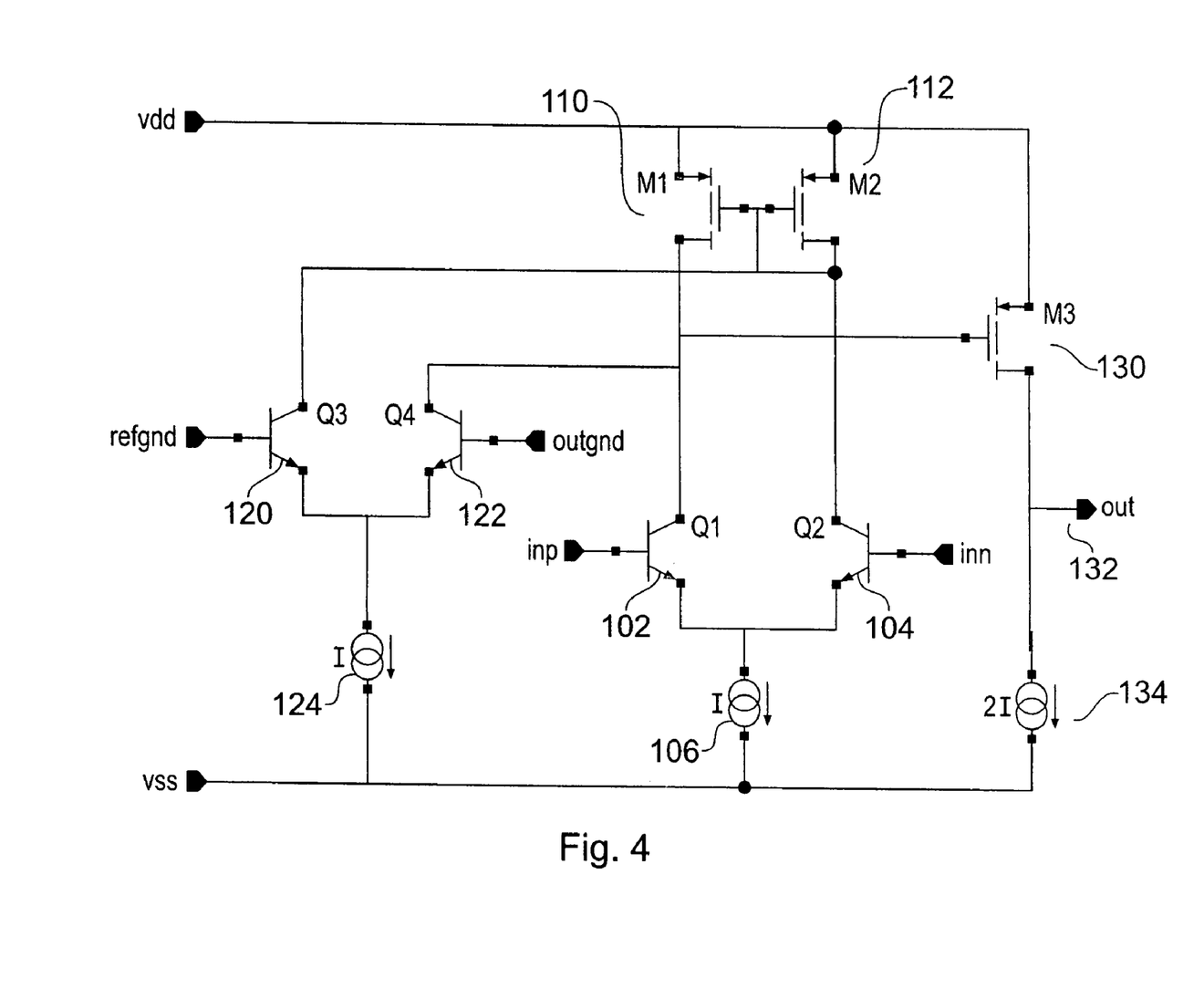
FIG. 4 schematically illustrates an operational amplifier including compensation means for use within the reference circuit shown in FIG. 3.

FIG. 4 schematically illustrates an amplifier having bipolar input transistors 102 and 104 connected in a long tail pair configuration with the current being sunk through a current source 106. The transistors 102 and 104 are further provided with active loads provided by a first MOSFET 110 connected between the collector of transistor 102 and the positive supply rail VDD, and a second MOSFET 112 connected between the collector of transistor 104 and the positive supply VDD. Gate terminals of the MOSFETS 110 and 112 are connected together and to the collector of the bipolar transistor 104. Configurations of this type are well known as input stages to operational amplifiers. However, the amplifier input stage has been modified by the inventor to include a second pair of transistors formed by a third bipolar transistor 120 and a fourth bipolar transistor 122 also connected in a long tail pair configuration and having their emitters connected to a second current source 124. The collector of the third bipolar transistor 120 is connected to the collector of the second bipolar transistor 104, and similarly the collector of the fourth bipolar transistor 122 is, in this embodiment, connected to the collector of the first bipolar transistor 102. Therefore the long tail pair input stages are provided in parallel, but share the same load as implemented by the MOSFETs 110 and 112. The gain ratio between the long tail pair input stages is controlled by the relative sizes of the currents flowing through the current synchs 106 and 124. The inventor has, in this example, set the currents flowing in each synch 106 and 124 to be the same value, and therefore the long tail pair input stages can be considered as being of equal significance.

Finally, in order to form an output of the operational amplifier a third MOSFET 130 is connected between the VDD power supply and an output terminal 132, and a current sink 134 is connected between the output terminal 132 and the negative supply rail VSS. In this example the current sink 134 passes twice the current that flows through either of the current sources 106 and 124. A gate of the third MOSFET 130 is connected to the collector of the first bipolar transistor 102.

In use, the base of the first bipolar transistor 102 act as the non-inverting input of the operational amplifier, whereas the base of the second transistor 104 acts as the inverting input. The base of transistor 120 acts as the reference ground input, whereas the base of the transistor 122 acts as the output ground input. We can see, intuitively, that an increase in the voltage occurring at the base of the first transistor 102 will cause that transistor to pass more current and therefore the voltage at its collector will fall. This will cause MOSFET 130 to be switched harder on and hence the voltage at the output of the operational amplifier 132 will rise. We can also see, when looking at the long tail pair comparing the ground voltages that if the output ground voltage occurring at the base of transistor 122 is slightly larger than the reference ground voltage occurring at the base of transistor 120 then transistor 122 will seek to pass more current and once again the voltage occurring at the collector of the first transistor 102, and consequently at the gate of the third MOSFET 130 will fall, once again tending to switch the MOSFET harder on. The operation of this circuit is, as is common to all operational amplifiers, stabilised by the provision of a feedback network around it.

The action of the correction circuit is to modify the or each reference voltage generated by the reference circuit, these voltages are then used within the digital to analog converter core. It should be noted that, with reference to FIG. 3, if it were desired to only have a single ended output, for example spanning between zero volts and +10 volts, then essentially the same circuit would be used but the resistor 80 would be either short circuited or replaced in its entirety by a metallic link. Therefore the output voltage from the second amplifier 70 would be nominally zero volts but it would still be subject to offsetting in accordance with the difference in voltage between the ground reference voltage and the output ground voltage.

It might be supposed that a voltage correction for the difference between the reference ground voltage and the output ground voltage could be applied at the buffer amplifier. However, applying the correction at the buffer amplifier, whilst possible is not favoured because the voltage correction that propagates its way through to the output of the buffer amplifier will vary as a function of the digital word being converted by the digital to analog converter core, as will be explained with reference to FIG. 7.

Figure 7:
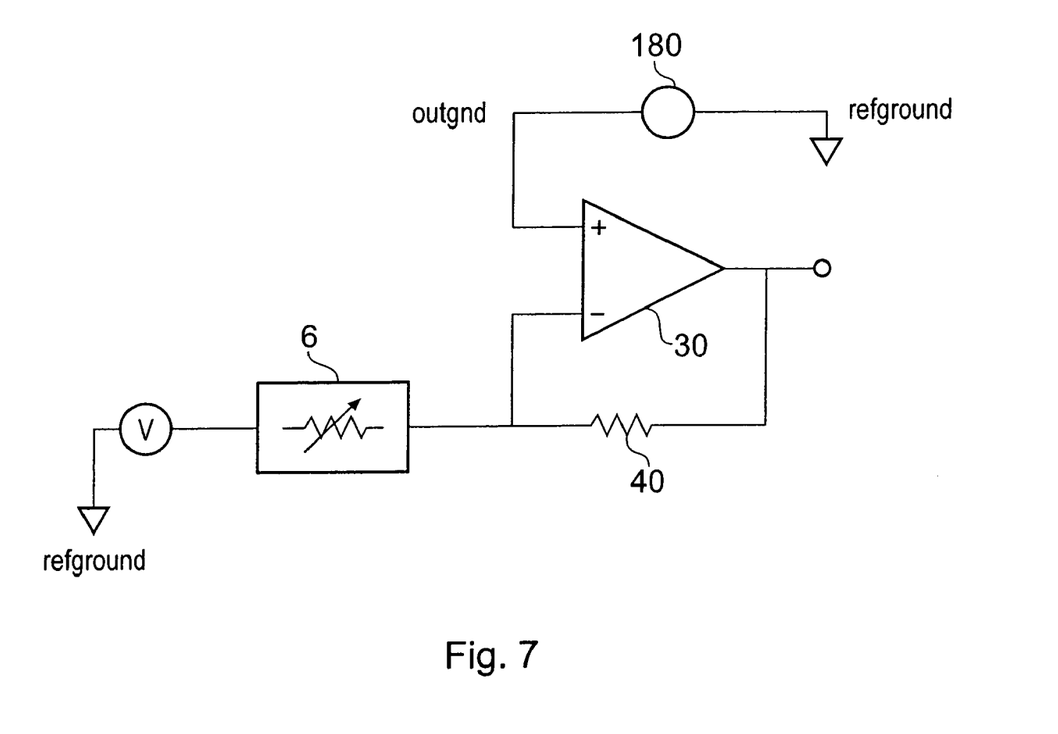
FIG. 7 is an equivalent circuit diagram representing the circuit topology as viewed from the input stages of the output stage operational amplifier in order to demonstrate why it is advantageous for the local ground offset correction to be made at the reference circuit.

For the purposes of FIG. 7, the REFGROUND voltage will be considered as being a master ground. The difference in voltage between the reference ground voltage and the output ground voltage can be represented by a voltage source 180. The voltage source is effectively connected to the non-inverting terminal of the amplifier 30.

The digital to analog converter core, as illustrated in FIG. 5 comprises a plurality of resistors and switches. Although the impedance of the R-2R ladder when looked at from the voltage reference input remains invariant, the same does not apply when its impedance is looked at from its output $I_{OUT1}$. It can be seen, for example, that if only the least significant bit is set, then the path between $I_{OUT1}$ and the reference ground has a value of approximately four times the unit resistance. If only the most significant bit is set, then the path to ground is only twice the unit resistance plus whatever impedance is provided by the circuit providing the reference voltage. These two examples serve to demonstrate that, when viewed from the output terminal $I_{OUT1}$, the impedance of the R-2R ladder varies as a function of the digital code that is being converted to the analog domain. As can be seen from FIG. 7 the gain of the output stage applied to the voltage from the source 180 will be the impedance of the resistor 40 divided by the impedance of the digital to analog converter core 6. Therefore the gain applied to the voltage generated by the voltage source 180 varies as a function of the digital code. It also follows therefore that if the voltage generator 180 provides the compensation voltage between output ground and reference ground, then the gain applied the compensation voltage will vary as the function of the digital code and hence compensation will not be achieved. However, by applying the compensation to the voltages used as references to the digital to analog converter core compensation can be achieved irrespective of the digital word being converted.

Figure 8:
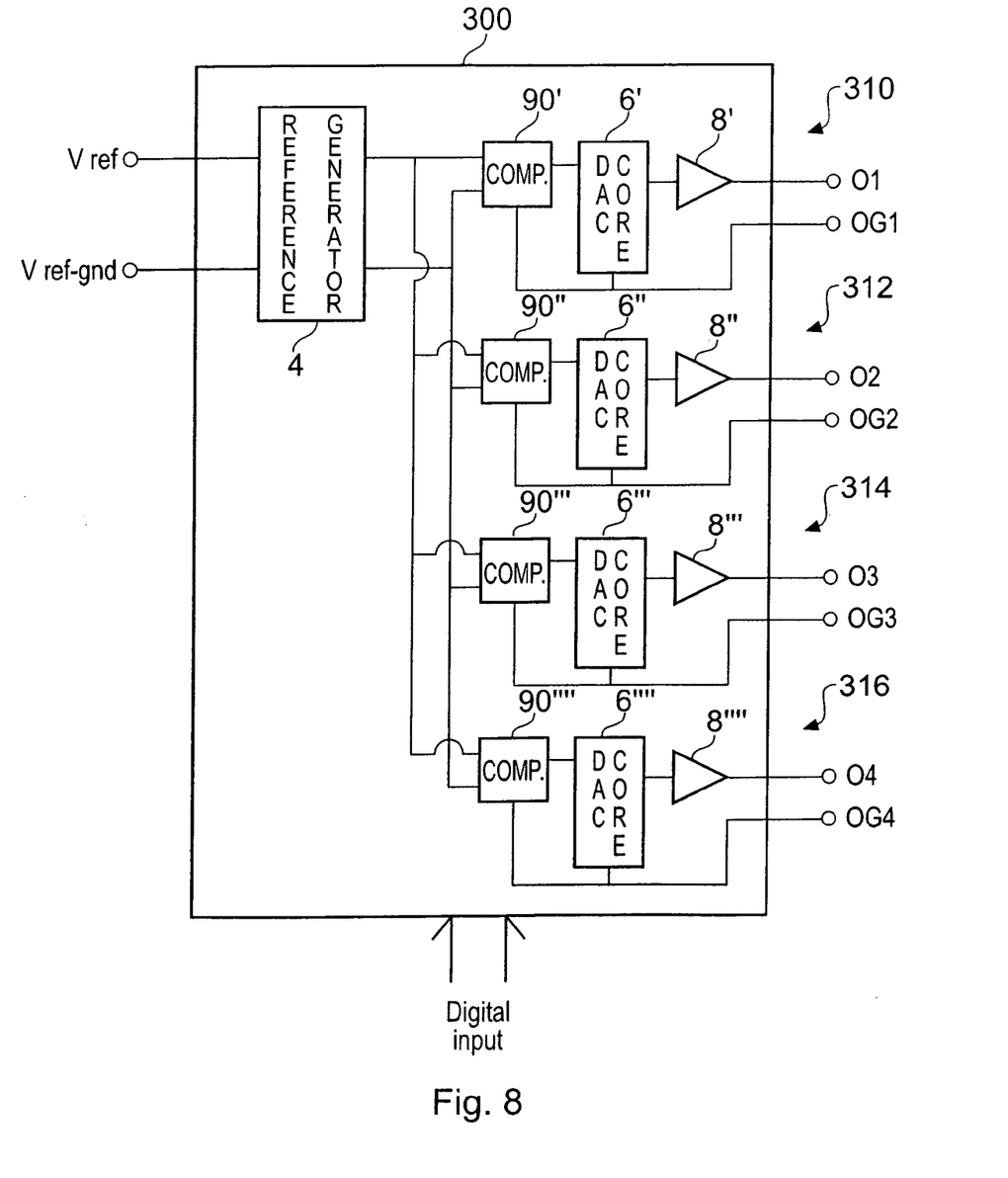
FIG. 8 schematically illustrated a digital to analog converter having four DAC within a single package.

FIG. 8 schematically illustrates a quad digital to analog converter package 300 in which four digital to analog converters 310-316 of the type described hereinbefore are encapsulated within a single device. Each converter 310-316 has its own respective output and output ground. Therefore the first converter 310 has a first output, labelled O1, and its respective output ground labelled OG1. The converters share digital control circuitry, (not shown), and also the reference and reference ground inputs, (Vref and Vref-gnd), but otherwise each is operable to independently convert a digital word, and each independently provides a ground voltage correction in proportion to the difference between the ground voltage occurring at the converter package, and the ground voltages OG1, OG2, OG3 and OG4 occurring in driven by the converters. The converters may share a common reference generation circuit 4 if the compensation circuit 90'-90'''' is implemented as a separate component. However, if amplifiers of the type shown in FIG. 4 are used, then each converter will have its own reference circuit.

The invention claimed is:

1. A digital to analog converter comprising:
   a) a digital to analog conversion core adapted to receive at least one reference voltage and a digital word to be converted, and to output an analog voltage as a function of the digital word and the at least one reference voltage;
   b) a sensing circuit for sensing a difference between a first ground voltage associated with an output of the digital to analog converter and a ground reference voltage occurring at the digital to analog converter; and
   c) a compensation circuit for applying a compensation voltage to the at least one reference voltage used by the conversion core of the digital to analog converter.

2. A digital to analog converter as claimed in claim 1, in which the digital to analog converter further comprises a reference voltage generator for generating at least one reference voltage and wherein the reference voltage generator has a reference ground input for receiving a voltage defining a ground voltage and a first reference input for receiving an external reference voltage from an external voltage source.

3. A digital to analog converter as claimed in claim 2, in which the reference voltage generator generates a first reference voltage $V_{REF+}$, and a second reference voltage, $V_{REF-}$, and both the first and second reference voltage are supplied to the compensation circuit.

4. A digital to analog converter as claimed in claim 2, in which the digital to analog converter comprises a plurality of digital to analog conversion cores each receiving at least one reference voltage from the reference voltage generator via a respective compensation circuit.

5. A digital to analog converter as claimed in claim 1, in which the digital to analog conversion core comprises a plurality of resistive elements in a R-2R ladder, and electronic switches are associated with each output node of the R-2R ladder such that each output node is selectively connectable to either of a first digital to analog converter core output or a second digital to analog converter core output.

6. A digital to analog converter as claimed in claim 5, in which the first and second digital to analog converter core outputs are held at substantially a common voltage such that, in use, the current flowing through the digital to analog converter core remains substantially constant.

7. A digital to analog converter as claimed in claim 6, in which the first output of the digital to analog converter is connected to ground and the second output of the digital to analog converter core is connected to an operational amplifier operating in a virtual earth mode.

8. A digital to analog converter as claimed in claim 7, in which a non-inverting input of the output stage operational amplifier is connected to an output ground connection for receiving a voltage corresponding to a ground voltage at a device being driven by the digital to analog converter.

9. A reference circuit for supplying reference voltages, the reference circuit comprising a reference voltage generator for generating at least one reference voltage and a compensation circuit responsive to a first voltage and to a second voltage, and to offset the at least one reference voltage as a function of a difference between the first and second voltages, wherein the first voltage is a ground voltage occurring at the reference circuit and the second voltage is a ground voltage occurring in a further circuit.

10. A method of operating a digital to analog converter comprising the steps of:
   a. Forming a difference value between a ground voltage occurring at a reference voltage generator used to supply a reference voltage to a conversion core of the digital to analog converter and a ground voltage occurring at a device driven by the digital to analog converter; and b. Applying that difference value to the digital to analog converter such that an output of the digital to analog converter is modified by the difference value.

11. A digital to analog converter comprising:
a) a plurality of digital to analog conversion cores receiving at least one reference voltage and a respective digital to word to be converted, and to output respective analog voltages as a function of the respective digital word and the at least one reference voltage, said cores having respective output ground terminals;
b) a plurality of sensing circuits for sensing respective voltage differences between a ground reference voltage occurring at the digital to analog converter and ground voltages occurring at output ground terminals of the respective digital to analog conversion cores; and
c) a plurality of compensation circuits for applying a compensation voltage to the at least one reference voltage used by a respective digital to analog conversion core so as to compensate for the respective voltage differences.

12. A digital to analog converter as claimed in claim 11, in which the digital to analog converter further comprises a reference voltage generator for generating at least one reference voltage and wherein the reference voltage generator has a reference ground input for receiving a voltage defining a ground voltage and a first reference input for receiving an external reference voltage from an external voltage source.

13. A digital to analog converter as claimed in claim 12, in which the reference voltage generator generates a first reference voltage $V_{REF+}$, and a second reference voltage, $V_{REF-}$, and both the first and second reference voltage are supplied to the compensation circuits.

14. A digital to analog converter as claimed in claim 11, in which the digital to analog conversion cores comprise a plurality of resistive elements in a R-2R ladder, and electronic switches are associated with each output node of the R-2R ladder such that each output node is selectively connectable to either of a first digital to analog converter core output or a second digital to analog converter core output, wherein the first and second digital to analog converter core outputs are held at substantially a common voltage such that, in use, the current flowing through the digital to analog converter core remains substantially constant.

15. A digital to analog converter as claimed in claim 14, in which the first output of the digital to analog converter core is connected to ground and the second output of the digital to analog converter core is connected to an operational amplifier operating in a virtual earth mode, and a non-inverting input of the operational amplifier is connected to the output ground connection for receiving a voltage corresponding to a ground voltage at a device being driven by the digital to analog converter.

16. A digital to analog converter having a voltage output at a first output thereof and an output ground, the digital to analog converter comprising:
a. a digital to analog conversion core adapted to receive at least one reference voltage and a digital word to be converted, and to output an analog voltage as a function of the digital word and the at least one reference voltage;

b. a sensing circuit for sensing a difference between a first ground voltage occurring at the output ground and a ground reference voltage occurring at the digital to analog converter; and c. a compensation circuit for applying a compensation voltage to the at least one reference voltage used by the conversion core of the digital to analog converter, the compensation voltage being formed from the difference between the first ground voltage occurring at the output ground and the ground reference voltage occurring at the digital to analog converter.

17. A digital to analog converter as claimed in claim 16, in which the digital to analog converter further comprises a reference voltage generator for generating at least one reference voltage and wherein the reference voltage generator has a reference ground input for receiving a voltage defining a ground voltage and a first reference input for receiving an external reference voltage from an external voltage source.

18. A digital to analog converter as claimed in claim 17, in which the reference voltage generator generates a first reference voltage $V_{REF+}$, and a second reference voltage, $V_{REF-}$, and both the first and second reference voltage are supplied to the compensation circuit.

19. A digital to analog converter as claimed in claim 17, in which the digital to analog converter comprises a plurality of digital to analog conversion cores each receiving at least one reference voltage from the reference voltage generator via a respective compensation circuit.

20. A digital to analog converter as claimed in claim 16, in which the digital to analog conversion core comprises a plurality of resistive elements in a R-2R ladder, and electronic switches are associated with each output node of the R-2R ladder such that each output node is selectively connectable to either of a first digital to analog converter core output or a second digital to analog converter core output.

21. A digital to analog converter as claimed in claim 20, in which the first and second digital to analog converter core outputs are held at substantially a common voltage such that, in use, the current flowing through the digital to analog converter core remains substantially constant.

22. A digital to analog converter as claimed in claim 21, in which the first output of the digital to analog converter core is connected to ground and the second output of the digital to analog converter core is connected to an operational amplifier operating in a virtual earth mode.

23. A digital to analog converter as claimed in claim 22, in which a non-inverting input of the operational amplifier is connected to an output ground connection for receiving a voltage corresponding to a ground voltage at a device being driven by the digital to analog converter.

24. A reference circuit for supplying reference voltages to a resistive potential divider, the reference circuit comprising a reference voltage generator for generating at least one reference voltage and a compensation circuit responsive to a first voltage and to a second voltage, and to offset the at least one reference voltage as a function of a difference between the first and second voltages, wherein the first voltage is a ground voltage occurring at the reference circuit and the second voltage is a ground voltage occurring in a further circuit.

* * * * *